United States Patent
Walkup et al.

(10) Patent No.: US 6,758,692 B2
(45) Date of Patent: Jul. 6, 2004

(54) HEAT SINK ASSEMBLY HAVING RETENTION MODULE

(75) Inventors: William B. Walkup, Hillsboro, OR (US); Hung-Chi Yu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/191,650

(22) Filed: Jul. 8, 2002

(65) Prior Publication Data

US 2004/0005808 A1 Jan. 8, 2004

(51) Int. Cl.$^7$ ................................................ H01R 13/00
(52) U.S. Cl. ..................... 439/485; 439/928.1; 361/704
(58) Field of Search .............................. 439/485, 928.1; 361/704, 715, 719

(56) References Cited

U.S. PATENT DOCUMENTS

| | | | | |
|---|---|---|---|---|
| 6,343,017 B1 | * | 1/2002 | Yu et al. ...................... | 361/704 |
| 6,396,696 B1 | * | 5/2002 | Lin et al. ..................... | 361/704 |
| 6,396,698 B1 | * | 5/2002 | Holcombe ................... | 361/704 |
| 6,434,004 B1 | * | 8/2002 | Matteson ..................... | 361/704 |
| 6,471,533 B2 | * | 10/2002 | Lai et al. ..................... | 439/331 |
| 6,563,213 B1 | * | 5/2003 | Wong et al. ................ | 257/727 |
| 2001/0030037 A1 | * | 10/2001 | Hellbruck et al. ......... | 165/80.3 |
| 2002/0060064 A1 | * | 5/2002 | Yu ............................. | 165/80.3 |
| 2002/0181205 A1 | * | 12/2002 | Shia et al. .................. | 361/704 |

* cited by examiner

Primary Examiner—Michael C. Zarroli
(74) Attorney, Agent, or Firm—Wei Te Chung

(57) ABSTRACT

A heat sink assembly includes a CPU mounted on a socket connector (1) and a retention module (5). The retention module comprises a pair of metal frames (50), a pair of retaining claps (56) and a pair of stop bars (54) assembled together with the metal frames. Each frame defines a bottom wall (51), a first side wall (52) and a pair of second side walls (54). Each retaining clip has a hook (56c) formed at a top of the retaining clip for hooking a corresponding stop bar, and a clamping portion (56e) formed at a bottom of the retaining clip. The clamping portion and a free end of the hook together clamp a side portion (41a) of a heat sink assembled to the socket connector.

10 Claims, 4 Drawing Sheets

HEAT SINK ASSEMBLY HAVING RETENTION MODULE

BACKGROUND OF THE INVENTION

1. Field of the Invention

The present invention relates to a heat sink assembly having a retention module, and particularly to a retention module for securing a heat sink to a CPU mounted on a socket connector.

2. Description of Related Art

Taiwan Patent Application No. 82212213 discloses a retention module 10 for securing a heat sink 22, a fan 21 and a CPU (central processing unit) 30 together. The retention module comprises a pair of retaining arms each including two separate parts engaged with each other. Each part forms an upper barb 11 and a lower barb 12. In assembly, the retention module is secured to corresponding channels defined in the heat sink, wherein the upper barbs engage to recesses defined in side edges of the fan, and the lower barbs engage to a bottom surface of the CPU so as to secure the heat sink, the fan and the CPU together. However, the complicated configuration of the retention module increases the manufacturing and assembling costs. In addition, the design of the channels of the heat sink further increases the manufacturing costs.

SUMMARY OF THE INVENTION

Accordingly, the object of the present invention is to provide a retention module having relatively simple structure for securing a heat sink to a CPU mounted on a socket connector.

In order to achieve the object set forth, an electrical connector assembly of the present invention comprises a socket connector on which a CPU is mounted and a retention module. The retention module comprises a pair of metallic frames, a pair of retaining clips and a pair of stop bars assembled together with the metallic frames. Each frame includes a bottom wall defining plural screw holes, a first side wall and two opposite second side walls. Each first side wall defines a first hole at a middle thereof. Each second side wall defines a retaining recess parallel to the bottom wall for retaining a corresponding stop bar therein. Each retaining clip has a hook at a top thereof for hooking a corresponding stop bar, and a clamping portion at a bottom thereof. The clamping portion and a free end of the hook clamp a side portion of a heat sink assembled to the socket connector. The retaining clip further includes a pair of securing portions at two opposite sides thereof. The securing portions comprise outward extending resilient tabs to engage with the first side wall of the frames.

Other objects, advantages and novel features of the invention will become more apparent from the following detailed description of the preferred embodiment when taken in conjunction with the accompanying drawings.

DETAILED DESCRIPTION OF THE INVENTION

Figure 1:
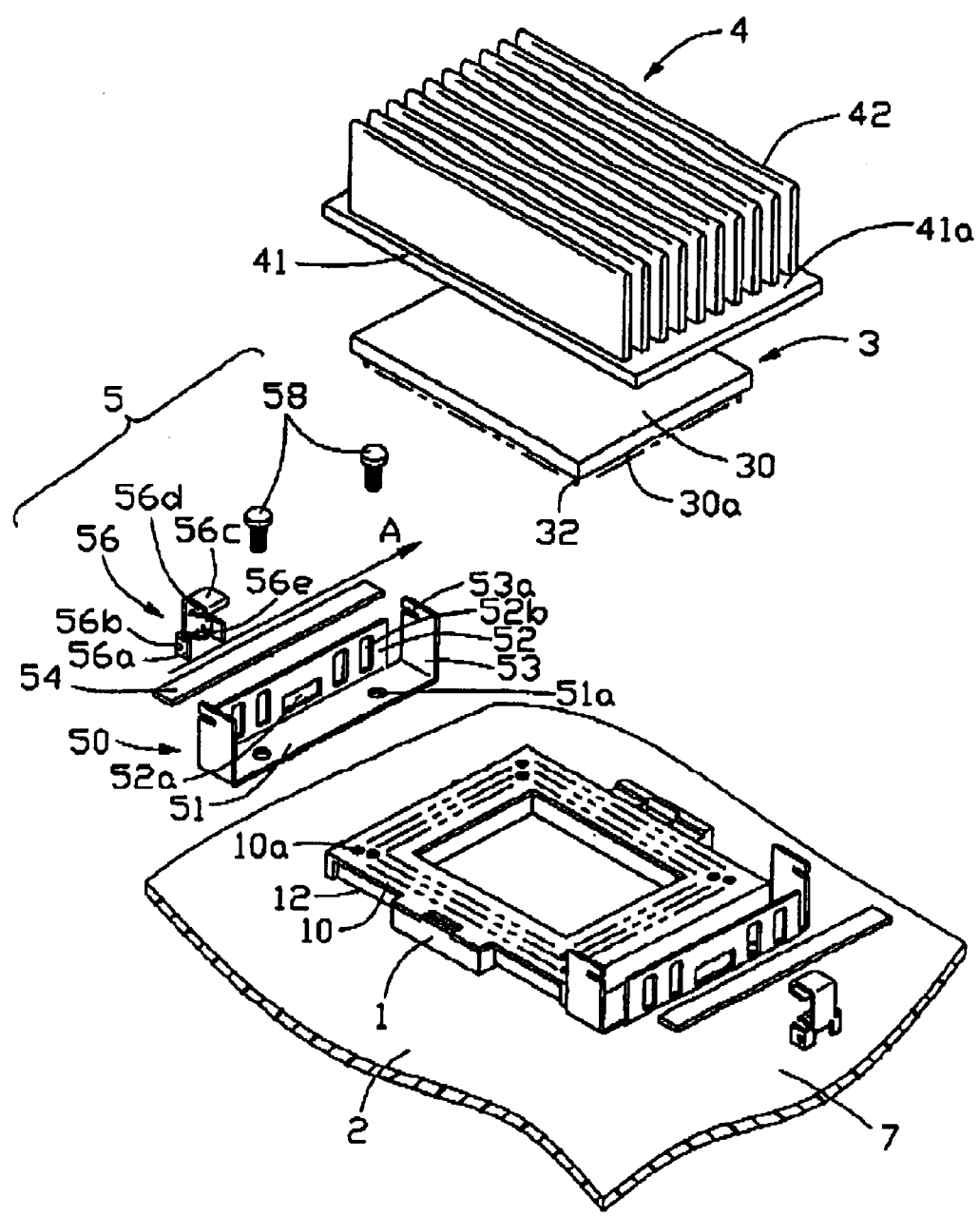
FIG. 1 is an exploded view of an electrical connector assembly of the present invention.
Figure 2:
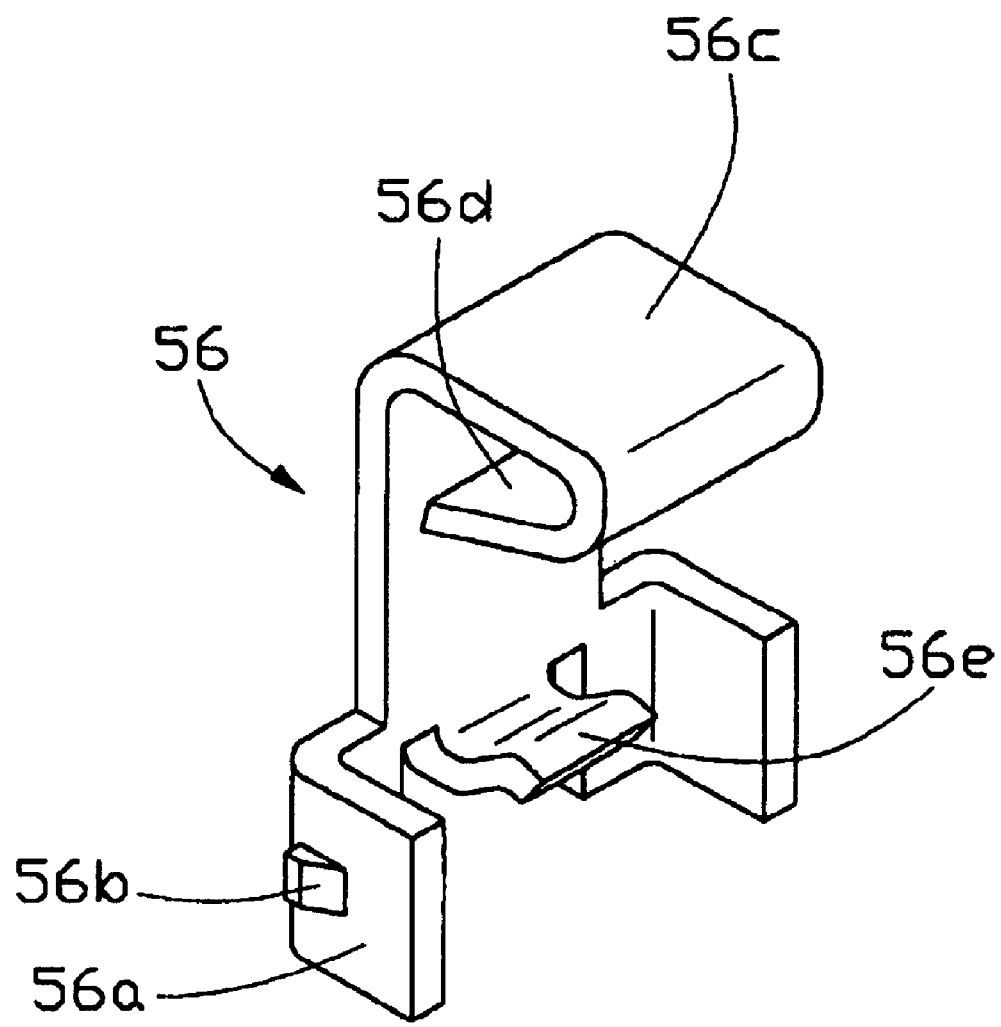
FIG. 2 is an enlarged view of retaining clips of the electrical connector of FIG. 1.

Reference will now be made to the drawing figures to describe the present invention in detail.

Referring to FIG. 1, the present invention comprises a socket connector 1 secured at a PCB (printed circuit board) 2, a CPU (central processing unit) 3 assembled on the connector 1, a heat sink 4 located at a top of the CPU 3 and a retention module 5 positioned at two opposite sides of the connector 1 for securing the heat sink 4 to the CPU 3.

Figure 3:
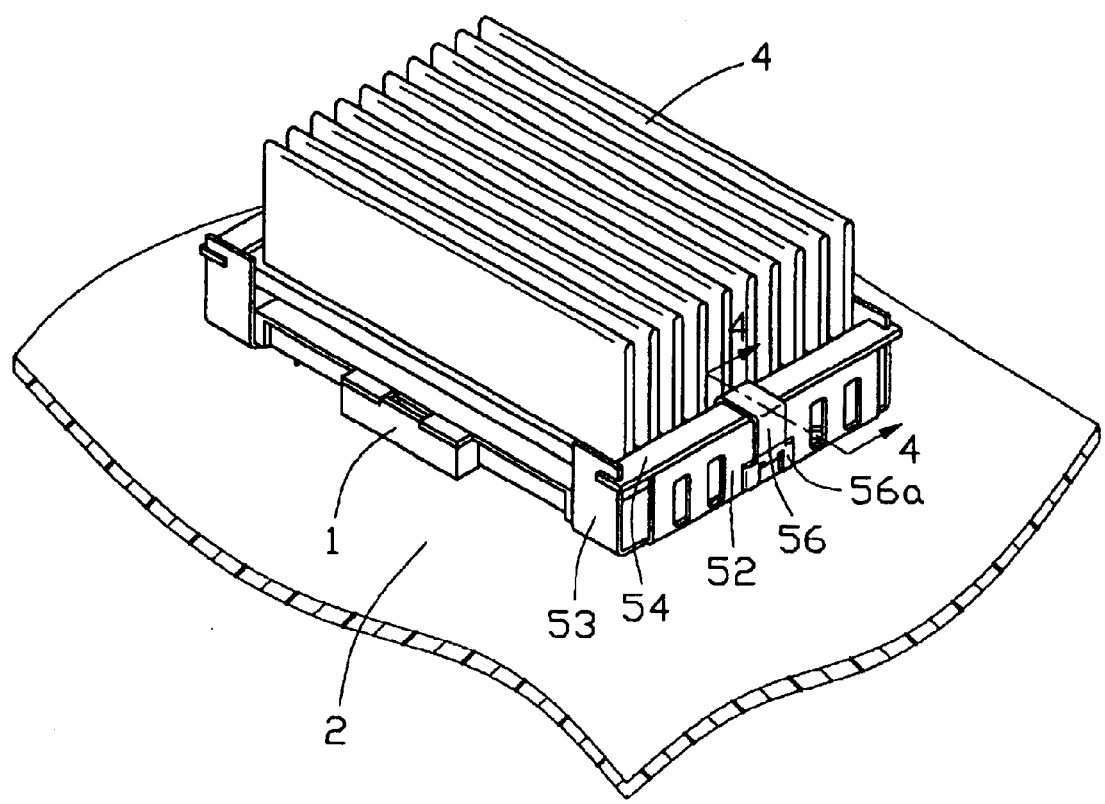
FIG. 3 is an assembled view of a heat sink assembly of the electrical connector of FIG. 1.
Figure 4:
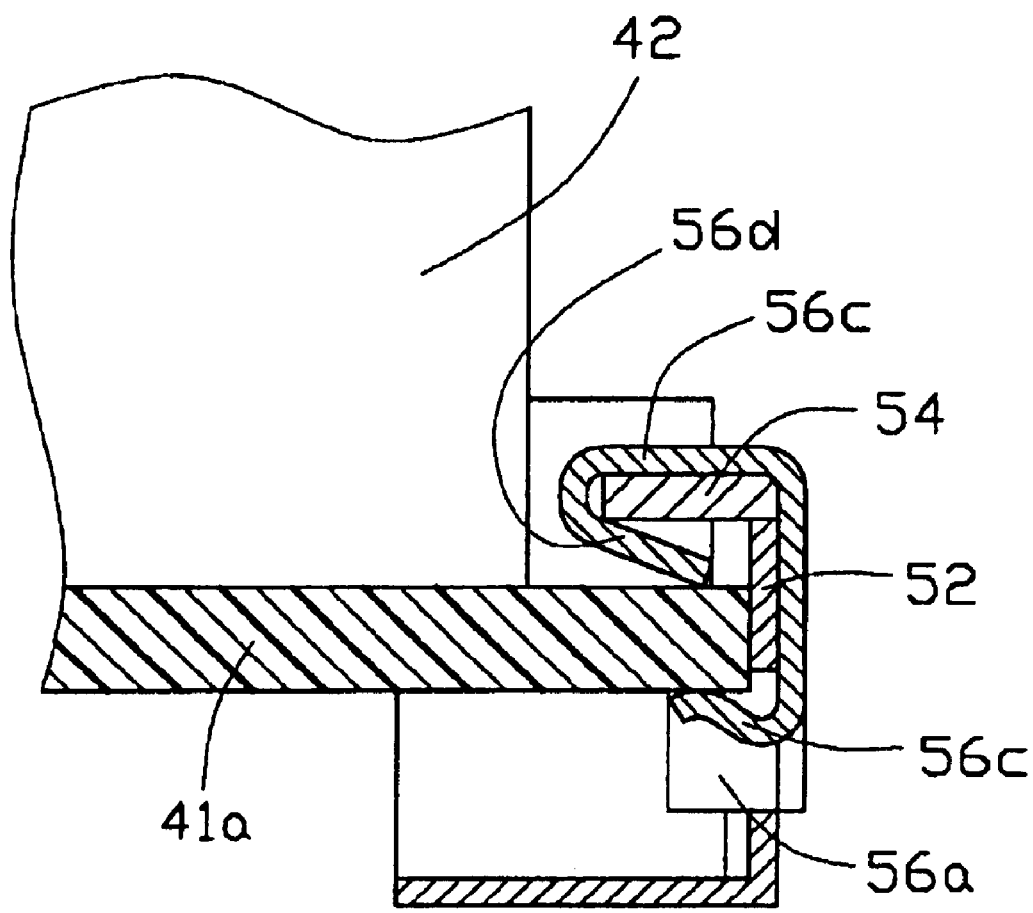
FIG. 4 is a partially cross-sectional view of FIG. 3 along line 4—4.

Also referring to FIG. 3, the connector 1 has a rectangular insulating housing 10 defining a plurality of receiving slots 10a therein, and a plurality of terminals 12 retained within the receiving slots 10a and being soldered to the PCB 2.

The CPU 3 comprises a flat main body 30 and a plurality of pins 32 downwardly extending from a bottom surface 30a of the body 30 for inserting into the receiving slots 10a of the housing 10 of the connector 1, thereby electrically contacting the terminals 12 retained within the connector 1.

The heat sink 4 comprises a body 41 and a plurality of fins 42 connected with the body 41 for dissipating heat generated by the CPU 3.

The retention module 5 comprises a pair of frames 50 arranged at two opposite sides of the connector 1. Each frame 50 comprises a bottom wall 51, an elongated first side wall 52 and a pair of second side walls 53. Each bottom wall 51 defines a pair of screw holes 51a. Each first side wall 52 defines a transverse first through hole 52a in a middle thereof and four longitude second holes 52b thereof beside the first hole 52a. Each second side wall 53 defines an elongate recess 53a parallel to the bottom wall 51 and opening at an edge near the first side wall 52.

The retention module 5 further comprises a pair of stop bars 54, a pair of retaining clips 56 and a pair of screws 58. The stop bars 54 have elongate and flat configuration and being engagingly secured to the recesses 53a of the second side walls 53 of the frames 50. Each retaining clip 56 comprises a pair of securing portions 56a at each of two opposite sides thereof for extending through the first through hole 52a. Each securing portion 56a includes an outward extending resilient tab 56b for abutting against an inner surface of the first side wall 52. Each retaining clip 56 further includes a hook 56c at a top thereof. the hook 56c defines a retaining spacer 56d therein for retaining the corresponding stop bar 54, and a clamping portion 56e at a bottom thereof. The clamping portion 56e and a free end of the hook 56c together clamp a side portion 41a of the heat sink 4.

In assembly, the connector 1 is first secured on the PCB 2. The frames 50 of the retention module 5 are positioned at the two opposite sides of the connector 1 on the PCB 2 by screwing the screws 58 to the screw holes 51a. The CPU 3 and the heat sink 4 are then sequentially assembled to the connector 1. Also referring to FIG. 1, direction "A" is defined as a front-to-back direction in the embodiment; the stop bars 54 horizontally extend through the retaining space 56d of the hooks 56c of the retaining clops 56 along the front-to-back direction (direction "A".) Finally, the retaining clips 56 with the stop bars 54 are engagingly retained to the recesses 53a of the second side walls 53. After assembly, the securing portions 56a extend through the first through holes 52a and the resilient tabs 56b abut against the inner surface of the first side wall 52 to prevent the retaining clips 56 from disengaging with the frames 50, the free end of the hook 56c and the clamping portion 56e securely clamp the side portion 41a of the heat sink 4. Thus, the heat sink is firmly secured to the socket connector 1.

A first advantage of the present invention is that the frames 50, the stop bars 54 and the retaining clips 56 can be easily manufactured and assembled together for their relatively simple structure. And the screws 58 are standard products. Thus, the manufacturing and assembling costs decreases respective to the cited art.

A second advantage of the present invention is that the retention module 5 is positioned at two opposite sides of the connector 1 but not extends through the heat sink 4 recited as the art. So the present invention uses existing heat sink. This can also decrease the manufacturing costs respective to the cited art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly for securing a heat sink, comprising:
   a socket connector located on a motherboard and including an insulative housing and a plurality of terminals retained within the housing; and
   a retention module including:
      a pair of frames located at two opposite sides of the connector, each frame defining a bottom wall secured to the motherboard and a first side wall connected with the bottom wall;
      a pair of retaining clips each having a securing portion at each of two opposite sides thereof for securing to a corresponding first side wall, a hook at a top thereof, and a clamping portion at a bottom thereof, the hook and the clamping portion together clamping a side portion of the heat sink;
      wherein the clamping portion of the retaining clip only contacts with the side portion of the heat sink.

2. The heat sink assembly as claimed in claim 1, wherein each bottom wall defines a pair of screw holes for securing a pair of screws.

3. The heat sink assembly as claimed in claim 1, wherein each first side wall defines a first hole, each securing portion defines a resilient tab at an outer side thereof to extend through the first hole and abut against an inner surface of the first side wall.

4. The heat sink assembly as claimed in claim 1, wherein the retention module further includes a pair of stop bars, the hooks of the retaining clips each define a retaining space therein for retaining the stop bars.

5. The heat sink assembly as claimed in claim 4, wherein each frame includes a pair of second side walls each defining a recess for retaining an end of a corresponding stop bar.

6. A heat sink assembly comprising:
   a heat sink adapted for being placed on a CPU and having two opposite portions;
   an electrical connector adapted for receiving the CPU;
   a pair of metal frames adapted for securing to a PCB and being spaced from the connector, each frame defining a pair of recesses;
   a pair of stop bars adapted for being secured to the frames respectively by the pair of recesses;
   a pair of retaining clips secured to the frames, respectively, each clip including a hook and a clamping portion at upper and lower edges thereof, a free end of the hook and the clamping portion together clamping the side portions of the heat sink;
   wherein a grounding path is established from the side portions of the heat sink through the retaining clips and the metal frames to the PCB.

7. A heat sink assembly comprising:
   a printed circuit board;
   a connector mounted on the printed circuit board;
   an electronic component seated upon the connector;
   a heat sink located upon said electronic component; and
   a retention module located around a periphery of said connector, said retention module including:
      a pair of opposite frames each having an elongated recess in communication with an exterior in a horizontal direction;
      a pair of rigid stop bars extending along a front-to-back direction and respectively secured to the recess of the corresponding frames along said horizontal direction; and
      a pair of resilient retaining clips respectively secured to the corresponding frames;
   wherein each of said retaining clip being located around a middle portion of the corresponding frame along said front-to-back direction, and retained to the corresponding stop bar and having means for downward abutment with the heat sink for pressing the heat sink against the electronic component thereunder.

8. The assembly as clamed in claim 7, wherein each of said frames is secured unto the printed circuit board.

9. The assembly as claimed in clam 7, wherein the means for downward abutment with the heat sink comprises a hook at a top of the retaining clip which downwardly abuts the heat sink.

10. The assembly as claimed in claim 7, wherein the retaining clip further comprises a clamping portion formed at a bottom thereof which upwardly abuts the heat sink.

* * * * *